United States Patent
Yu et al.

(10) Patent No.: US 6,362,085 B1
(45) Date of Patent: Mar. 26, 2002

(54) METHOD FOR REDUCING GATE OXIDE EFFECTIVE THICKNESS AND LEAKAGE CURRENT

(75) Inventors: Mo-Chiun Yu, Taipei; Syun-Ming Jang; Chen-Hua Yu, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/619,029

(22) Filed: Jul. 19, 2000

(51) Int. Cl.$^7$ .......................................... H01L 21/4763
(52) U.S. Cl. ...................................... 438/585; 438/407
(58) Field of Search ................................ 438/585, 287, 438/300–305, 308, 407, 526, 775; 257/411, 640, 760, 369, 325

(56) References Cited

U.S. PATENT DOCUMENTS

| | | | |
|---|---|---|---|
| 5,596,218 A | * 1/1997 | Soleimani et al. | 257/369 |
| 5,750,435 A | 5/1998 | Pam | 438/525 |
| 5,891,798 A | 4/1999 | Doyle et al. | 438/624 |
| 5,923,983 A | 7/1999 | Fulford, Jr. et al. | 438/287 |
| 5,939,763 A | 8/1999 | Hao et al. | 257/411 |
| 6,060,369 A | * 6/2000 | Gardner et al. | 438/407 |
| 6,110,784 A | * 8/2000 | Gaedner et al. | 438/287 |

OTHER PUBLICATIONS

Wolf, "Silicon Processing for the VLSI Era", vol. 3: The Submicron MOSFET, Lattice Press Sunset Beach, CA, (1995), p. 438.

Wolf, "Silicon Processing for the VLSI Era", vol. 3: The Submicron MOSFET, Lattice Press Sunset Beach, CA, (1995), pp. 648–661.

* cited by examiner

*Primary Examiner*—David Nelms
*Assistant Examiner*—Dung Ang Le
(74) *Attorney, Agent, or Firm*—George O. Saile; Stephen B. Ackerman

(57) ABSTRACT

A process for forming a nitrogen enriched ultra thin gate oxide is described. The nitrogen enrichment increases the dielectric constant of the gate oxide thereby decreasing it's effective oxide thickness. This in turn enhances the performance of MOSFET devices formed thereon. The nitrogen enrichment is accomplished by first enriching the surface of a silicon wafer with nitrogen by implanting nitrogen atoms into the silicon through a sacrificial screen oxide. After fixing the nitrogen by annealing, a nitrogen enriched gate oxide is thermally grown. Additional nitrogen is then infused into the gate oxide by remote plasma nitridation. This two step nitrogen enrichment process increases the dielectric constant of the gate oxide by a significant amount, approaching that of silicon nitride which not only decreases it's effective thickness with respect to gate capacitance, but also lowers device leakage by suppressing hot carrier injection over device drain regions. In addition, because the initial silicon surface is nitrogen rich, the thermal oxidation rate is reduced. The reduction of oxidation rate improves process control by making the oxidation time and temperature more manageable. A further benefit nitrogen of enrichment of the gate oxide is improvement of the durability of the gate oxide when used as an etch stop during polysilicon gate patterning.

27 Claims, 4 Drawing Sheets

METHOD FOR REDUCING GATE OXIDE EFFECTIVE THICKNESS AND LEAKAGE CURRENT

BACKGROUND OF THE INVENTION (1) Field of the Invention

The invention relates to processes for the manufacture of semiconductor devices and more particularly to processes for forming high performance self-aligned polysilicon gate field effect transistors with ultra thin gate dielectric.

(2) Background to the Invention and Description of Related Art

The basic MOSFET (metal oxide semiconductor field effect transistor) is typically formed by a self-aligned polysilicon gate process. An region of active silicon region surface for the device is defined on a silicon wafer by an opening surrounded by field oxide isolation(FOX). A gate dielectric, typically silicon oxide, is grown on the exposed silicon regions by thermal oxidation. A polysilicon gate electrode is then patterned over the gate oxide. Source and drain regions are formed in the active silicon region, typically by ion implantation and the device is completed by depositing an insulative layer over the wafer and forming contacts to the source/drain regions and to the gate electrode through openings in the insulative layer.

The performance of the MOSFET is inversely proportional to the gate oxide thickness. Efforts to enhance performance as well as reduce power consumption have driven gate oxide thicknesses to well below 100 Angstroms. It was originally predicted that the physical limit of gate oxide thickness is somewhere around 30Å because below this thickness carriers are removed by direct tunneling, faster than they can be supplied by thermal generation (Wolf, S., "Silicon Processing for the VLSI Era", Vol.3, Lattice Press, Sunset Beach, Calif., (1995), p438). However, recent studies by scientists at Bell Laboratories now predict that the physical limit is of the order of 5 atoms which translates to about 14Å for an $SiO_2$ dielectric.

MOSFET devices are currently being developed which have gate oxide thicknesses as low as 20Å. As one might expect, serious new problems arise when the technology is driven to such levels requiring the design of new methods to deal with them. Although some of these problems may not be totally soluble with today's technology, it is prudent to selectively exploit situations where the effects of these problems are minimal.

An alternative approach which not only improves device performance by reducing the effective gate oxide thickness but also reduces leakage current is the incorporation of nitrogen in the gate oxide thereby increasing the dielectric constant and increasing hot carrier resistance. Many attempts have been made to improve hot carrier hardness by nitriding relatively thick (500Å) gate oxides in $NH_3$, $N_2O$ and NO at high temperatures. In most instances undesirable side effects were encountered (See Wolf, S., loc. cit. pp 648–661).

Hao, et.al., U.S. Pat. No. 5,939,763 shows a method for forming an ultra thin silicon oxynitride layer on a silicon wafer by annealing the wafer first in nitric oxide and then growing the oxynitride in $N_2O$ and NO. The resultant oxynitride layer is nitrogen rich at both the Si interface and at it's upper surface. An obvious drawback of this method is the hazards of using nitric oxide which is applied at atmospheric pressure. Doyle, U.S. Pat. No. 5,891,798 shows a method for depositing a high dielectric constant material, such as a paraelectric or ferroelectric material, onto silicon as a gate dielectric. In order to prevent oxidation of the subjacent silicon by oxygen from the deposited dielectric material, the silicon is first implanted with nitrogen to form a nitrogen enriched surface. In general, forming gate oxides by deposition methods is not desirable because of contamination risks as well as difficulty in achieving stable and reproducible interface characteristics in the channel region.

Soleimani, et. al., U.S. Pat. No. 5,596,218 implants nitrogen into silicon through a sacrificial oxide. After annealing, the nitrogen concentrates in both the oxide and silicon at the $SiO_2/Si$ interface. The sacrificial oxide is stripped and a gate oxide is grown. After gate oxide growth, nitrogen in the silicon extends 1000Å into the silicon and a distance upward into the gate oxide of about 10–20 percent of the oxide thickness. The high concentration of nitrogen in the gate oxide reduces the "hot carrier" effect by preventing charge build-up in the oxide.

Pan, U.S. Pat. No. 5,750,435 shows a method of implanting nitrogen or fluorine ions at an angle into the gate oxide under the edges of a gate electrode. This hardens the oxide to hot carrier injection which tends to occur in these edge regions. Fulford, et. al., U.S. Pat. No. 5,923,983 cites the introduction of nitrogen into the same critical edge regions during a post-gate-etch oxidation, by adding a nitrogen containing species to the oxidizing gas. Again the object is to harden the oxide edge region near the drain to hot carrier injection.

The efforts of the various references are directed towards achieving hot electron hardness in the regions of the gate oxide wherein this phenomenon occurs. The desirability of increasing the overall dielectric constant of the gate oxide in order to improve device performance has not become an issue until now when gate oxide thicknesses appear to approaching their physical limit. By increasing the dielectric constant of the gate dielectric over conventional silicon oxide, the effective oxide thickness is reduced.

SUMMARY OF THE INVENTION

It an object of this invention to provide a method for decreasing the effective gate oxide thickness of gate oxides grown to near their lower physical limit of practical usefulness.

It is yet another object of this invention to provide a method for increasing the dielectric constant of ultra thin gate oxides while concurrently improving their hot carrier hardness and reducing leakage currents.

It is still another object of this invention to provide a method for forming a gate oxide with improved electrical quality, reduced effective oxide thickness while at the same time achieving improved process control.

It is yet another object of this invention to provide a method for increasing the durability of a gate oxide towards attack by halogen based etchants used to pattern polysilicon gate electrodes.

These objects are accomplished by first enriching the surface of a silicon wafer with nitrogen by implanting nitrogen atoms into the silicon surface through a sacrificial screen oxide. After fixing the nitrogen by annealing, a nitrogen enriched gate oxide is thermally grown. Additional nitrogen is then infused into the gate oxide by remote plasma nitridation. This two step nitrogen enrichment process increases the dielectric constant of the gate oxide by a significant amount, not only decreasing it's effective thickness with respect to gate capacitance, but also lowers leakage currents by increasing gate oxide resistance to hot carrier injection. In addition, because the initial silicon surface is nitrogen rich, the thermal oxidation rate is reduced. The reduction of oxidation rate improves process control by making the oxidation time and temperature more manageable.

In addition to increasing the dielectric constant of the gate oxide and thereby reducing it's effective thickness, the incorporation of nitrogen in the oxide also increases the resistance of the oxide to attack by halogen based etchants used to pattern the gate electrode. Patterning the gate electrode comprises anisotropic etching of the polysilicon layer and stopping in the gate oxide. A typical etchant used to etch through the final portion of the polysilicon is HBr. In the patterning process, the gate dielectric must not only halt the HBr etch after the polysilicon has been penetrated in the regions to be cleared, but must also protect the subjacent silicon from etchant penetration during an over-etch period which assures the thorough removal of all vestiges of unwanted polysilicon. Nitrogen enrichment of the gate oxide, according to the method taught by this invention, decisively increases the silicon-to-gate oxide selectivity and thereby provides the added benefit to the gate patterning process.

DESCRIPTION OF THE PREFERRED EMBODIMENTS

In a first embodiment of this invention a silicon wafer is provided. The silicon wafer is first subjected to a standard RCA cleaning process. The RCA cleaning process was first introduced in 1970 by Kern and Poutinen at RCA and is well known in the art. Since it's introduction many variations of the process have been developed. Details of this procedure may be found in Wolf, S. and Tauber, R.N., "Silicon Processing for the VLSI Era", Vol. 1, Lattice Press, Sunset Beach, Calif., (1986),p516.

Figure 1A:
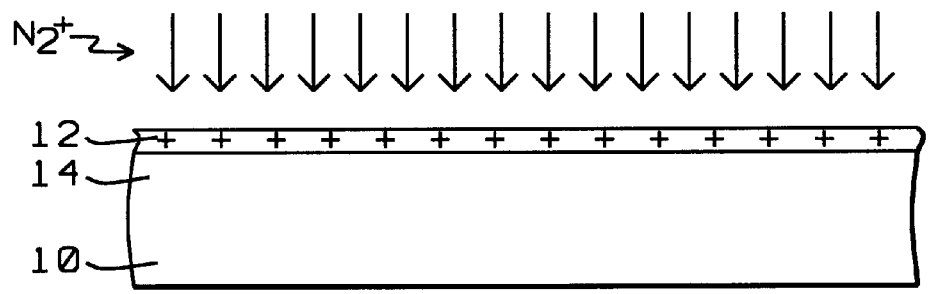
FIGS. 1A through FIG. 1D are cross sections illustrating processing steps for the formation nitrogen enriched gate oxide according to a first embodiment of this invention.

Referring to FIG. 1A, after the RCA cleaning, a sacrificial silicon oxide layer 12 is thermally grown on the silicon wafer 10. The oxide layer 12 is grown at between about 800 and 1,000° C. in dry oxygen to a thickness of between about 45 and 55 Angstroms. Next the wafer 10 is ion implanted with nitrogen molecule ions ($N_2^+$) at a dose of between about $1 \times 10^{14}$ and $1 \times 10^{15}$ atoms/cm$^2$ and at an energy of between about 5 and 10 keV. This places the centroid of the ion implant 14 within the oxide, just above the oxide/silicon interface. The sacrificial oxide 12 acts as a screen oxide during the nitrogen implantation.

Figure 1B:
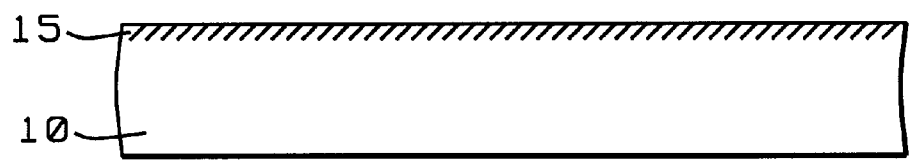

The wafer 10 is then annealed in a nitrogen ambient at a temperature of between about 1,000 and 1,050° C. for a period of between about 10 and 30 seconds by RTP (rapid thermal processing) to activate the implanted nitrogen species by accumulating and fixing them in the silicon at the oxide/silicon interface. After the RTP the sacrificial oxide 12 is stripped with dilute HF leaving a thin nitrogen rich layer 15 on the surface of the silicon wafer 10 as illustrated in FIG. 1B.

Figure 1C:
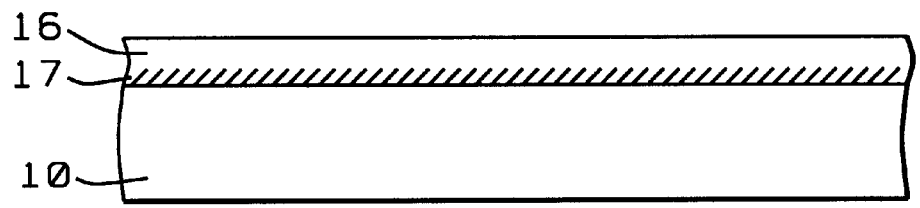

Referring to FIG. 1C, a gate oxide 16 is grown on the wafer 10 whereby the nitrogen rich surface 15 is consumed by the oxide, thereby forming a gate oxide with a significant nitrogen enrichment 17. This is observed by an increase in dielectric constant of the oxide to a value greater than or about equal to 4.0. This is decidedly greater than the accepted dielectric constant for stoichiometric $SiO_2$ (3.85). The gate oxide 16 is grown to a thickness of between about 15 and 30 Angstroms at a temperature of between about 700 and 900° C., preferably in dry oxygen. Alternately water vapor may be included in the oxidation. The oxidation time is between about 30 to 60 seconds. The oxidation is preferably performed either by ISSG (in-situ steam generation) or by RTO (rapid thermal oxidation). Both of these methods are familiar to those in the art.

Because the silicon surface is nitrogen rich, the oxidation proceeds at a slower rate than conventional oxidation. The region 17, of the oxide 16 near the silicon/oxide interface becomes nitrogen enriched. This enrichment results in an overall dielectric constant of the "as grown" gate oxide greater than that of stoichiometric $SiO_2$. The suppression of oxide growth by nitrogen enrichment of silicon has been known for many years and is often referred to as the Kooi effect. (See Wolf, S., "Silicon Processing for the VLSI Era", Vol.2, Lattice Press, Sunset Beach, Calif., (1990), p27). Advantageously to the present invention, this reduction of the oxidation rate allows for greater process control which is welcomed for thermally growing ultra thin gate oxides. Oxidation time and temperature become much more manageable.

After oxidation the wafer 10 is loaded into a remote plasma tool. The tool comprises a first chamber wherein a plasma is struck in a gas flow. A suitable remote plasma tool is commercially available from Applied Materials Corporation of Santa Clara, Calif. The wafer 10 is placed in a second chamber located downstream from the first chamber so that species generated within the plasma pass over the wafer before being pumped out of the tool. In this manner, the gate oxide 16 is not directly exposed to the plasma and therefore does not suffer plasma damage. Nitrogen is flowed into the plasma chamber at a flow rate of between about 600 and 3,000 SCCM (Standard cubic centimeters per minute). Alternately $NH_3$ may be used, either instead of or in combination with nitrogen. The pumping rate of the tool is throttled to maintain a chamber pressure of between about 1 and 3 Torr in the second chamber. A plasma is struck in the first chamber and active nitrogen species from the remote plasma flow over the wafer surface and incorporate into the gate oxide 16 thereby nitriding an upper portion 18 (FIG. 1D) of the gate oxide 16. The remote plasma nitridation is conducted with the wafer 10 heated to a temperature between about 500 and 1,000° C. for a period of between about 3 and 5 minutes.

The plasma nitridation, which increases the nitrogen content, notably in the upper portion 18 of the gate oxide 16, thereby further increases the dielectric constant of the gate oxide 16 to between about 4.5 and 6.0. This value approaches the dielectric constant of silicon nitride which is between about 6 and 7. With this increase in dielectric constant, the effective "oxide" thickness of a nitrided gate oxide, which is actually 20 Angstroms thick, is between about 13 and 17 Angstroms. The effective oxide thickness ($d_{eff}$ or EOT) is defined as the thickness silicon oxide would have to be in order to have the same capacitance per unit area, as the nitrided oxide, that is:

$$d_{eff} = d_N \epsilon_{ox} / \epsilon_N$$

where:

$\in_{ox}$=the dielectric constant of $SiO_2$ (3.85)
$\in_N$=the dielectric constant of the nitrided oxide, and
$d_N$=the actual nitrided oxide thickness.

Figure 1D:
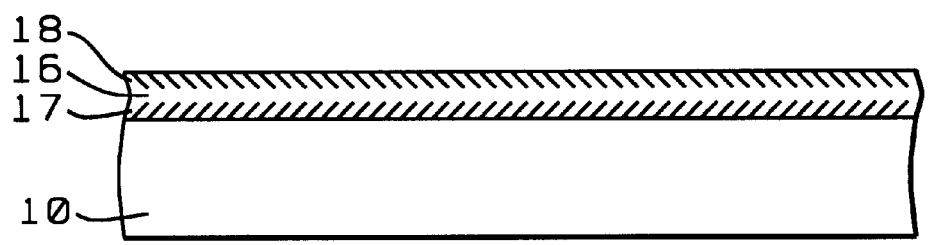

For purposes of illustration in FIG. 1D, the upper and lower nitrogen enriched regions 17 and 18 are shown to be separated. However, in reality they are overlapped in ultra thin oxides, and the overall gate oxide 16 is nitrogen enriched throughout.

By reducing the effective oxide thickness, the performance of a MOSFET formed on the gate oxide is improved, not only in speed but also in reliability and with lower leakage because the nitridation has made the region over the drain more resistant to hot electron trapping.

Figure 2A:
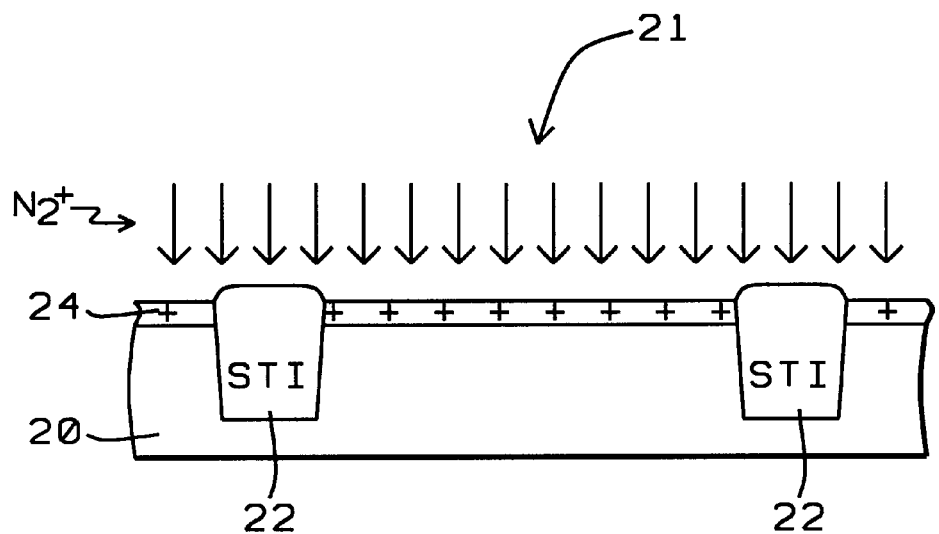
FIGS. 2A through FIG. 2F are cross sections illustrating processing steps for the formation of a MOSFET with a nitrogen enriched gate oxide according to a second embodiment of this invention.

In a second embodiment a self-aligned polysilicon gate MOSFET is formed with a gate dielectric with a reduced effective oxide thickness. The procedure is illustrated by FIGS. 2A through 2F. A p-type monocrystalline silicon wafer silicon wafer 20 is provided. Referring to FIG. 2A, there is shown a cross section of a region 21 of the wafer 10.wherein a MOSFET is to be formed A shallow trench field oxide 22 is formed in the wafer 20 by patterning a trench in the silicon, surrounding an active region wherein the MOSFET is to be formed. and then filling the trench with an insulative material such as silicon oxide. A field oxide formed in this manner is referred to as shallow trench isolation (STI). Procedures for forming STI are well known and widely practiced in the art. The silicon wafer is first subjected to a standard RCA cleaning process. The RCA cleaning process is identical to that used to form the first embodiment of this invention.

After the RCA cleaning, a sacrificial silicon oxide layer 24 is thermally grown on the silicon wafer 20. The oxide layer 24 is grown at between about 800 and 1,000° C. in dry oxygen to a thickness of between about 45 and 55 Angstroms. Next the wafer 20 is ion implanted with nitrogen molecule ions ($N_2^+$) at a dose of between about $1 \times 10^{14}$ and $1 \times 10^{15}$ atoms/cm$^2$ and at an energy of between about 5 and 10 keV. This places the centroid of the ion implant within the oxide, just above the oxide/silicon interface. The sacrificial oxide 24 acts as a screen oxide during the nitrogen implantation.

Figure 2B:
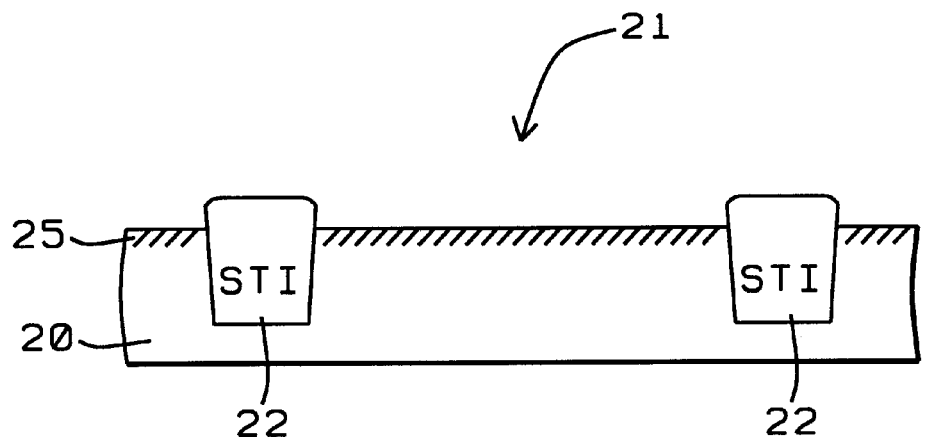

The wafer 20 is then annealed in a nitrogen ambient at a temperature of between about 1,000 and 1,050° C. for a period of between about 10 and 30 seconds by RTP to activate the implanted nitrogen species by accumulating and fixing them within the silicon at the oxide/silicon interface. After RTP the sacrificial oxide 24 is stripped with dilute HF leaving a thin nitrogen rich layer 25 on the surface of the silicon wafer 20 as illustrated in FIG. 2B.

Figure 2C:
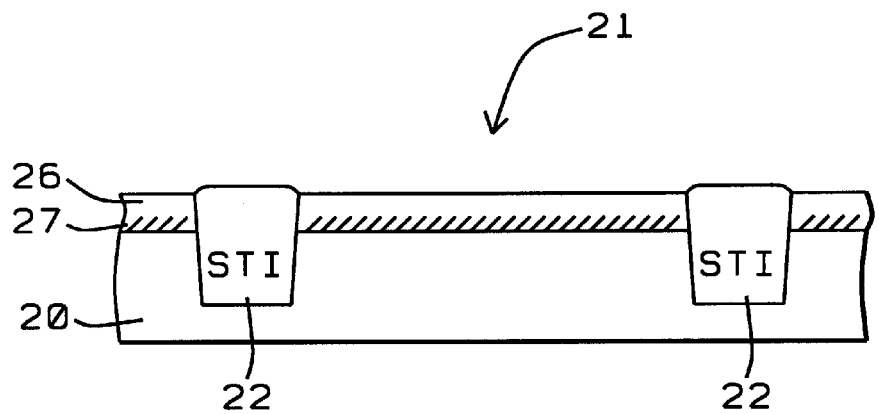

Referring to FIG. 2C, a gate oxide 26 is grown on the wafer 20 whereby the nitrogen rich surface 25 is consumed by the oxide, thereby forming a gate oxide with a significant nitrogen enrichment 27. This is observed by an increase in dielectric constant of the oxide to a value greater than or about equal to 4.0 which is decidedly greater than the accepted dielectric constant for stoichiometric $SiO_2$.

The gate oxide 26 is grown to a thickness of between about 15 and 30 Angstroms at a temperature of between about 700 and 900° C., preferably in dry oxygen. Alternately water vapor may be included in the oxidation. The oxidation time is between about 30 to 60 seconds. The oxidation is preferably performed either by ISSG or by RTO as in the first embodiment. Advantageously, as in the first embodiment, the reduction of the oxidation rate of the nitrogen rich silicon surface allows for greater process control which is welcomed for thermally growing ultra thin gate oxides. Oxidation time and temperature become much more manageable.

Figure 2D:
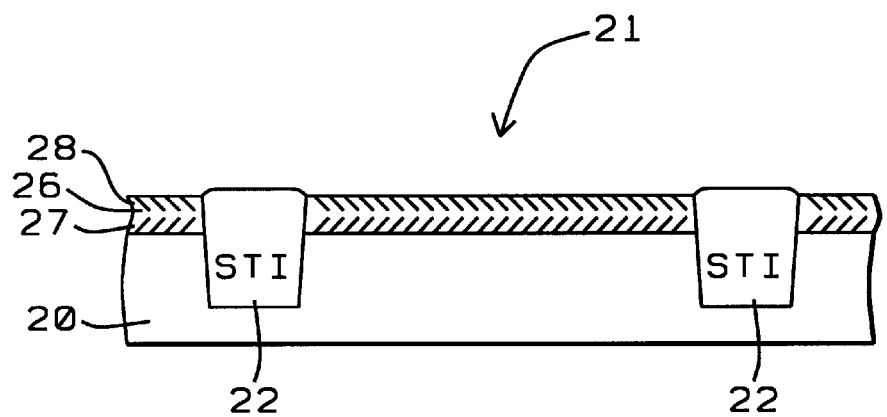

After oxidation the wafer is loaded into a remote plasma tool as described in the first embodiment. The tool comprises a first chamber wherein a plasma is struck in a gas flow. The wafer is placed in a second chamber located downstream from the first chamber so that species generated within the plasma pass over the wafer before being pumped out of the tool. In this manner, the gate oxide 26 is not directly exposed to the plasma and therefore does not suffer plasma damage. Nitrogen is flowed into the plasma chamber at a flow rate of between about 600 and 3,000 SCCM. Alternately $NH_3$ may be used, either instead of or in combination with nitrogen. The pumping rate of the tool is throttled to maintain a chamber pressure of between about 1 and 3Torr in the second chamber. A plasma is struck in the first chamber and active nitrogen species from the remote plasma flow over the wafer surface and incorporate into the gate oxide 26 thereby nitriding an upper portion 28 of the gate oxide 26 as illustrated in FIG. 2D. The remote plasma nitridation is conducted with the wafer 30 heated to a temperature between about 500 and 1,000° C. for a period of between about 3 and 5 minutes.

The plasma nitridation, which increases the nitrogen content in the upper portion 28 of the gate oxide 26, thereby further increases the dielectric constant of the gate oxide 26 to between about 4.5 and 6. With this increase in dielectric constant, the effective "oxide" thickness, $d_{eff}$, of a nitrided gate oxide, which is actually 20 Angstroms thick, is between about 13 and 17 Angstroms.

Figure 2E:
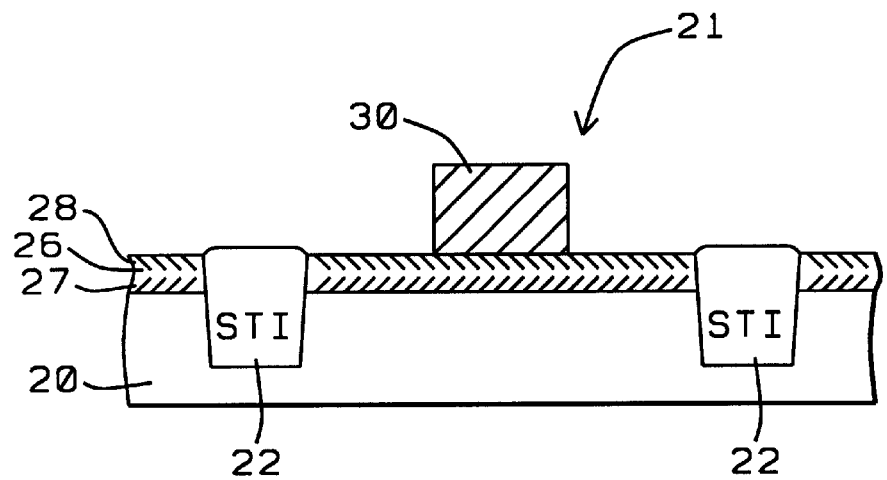

Referring now to FIG. 2E, a polysilicon gate electrode 30 is patterned over the gate oxide 26. The polysilicon gate electrode may be formed in a number of ways, for example of a laminar structure having a doped polysilicon layer over an undoped polysilicon layer. Alternately, a polycide structure, comprising a silicide layer over a polysilicon layer, may be used to form the gate electrode 30. Configurations and methods for forming polysilicon gate electrodes are well known to those in the art, and because they do not affect the method of the present invention, they need not be described in detail. Polysilicon gate patterning is accomplished by anisotropic etching (RIE) of the polysilicon or polycide layers with a plasma containing a halogen or halogen compound. The final etch through is typically done using HBr because of the relatively high silicon-to-gate oxide etch rate ratio which can be achieved with this component. The ever decreasing gate oxide thicknesses have made stopping within the gate oxide without penetration of the underlying silicon more difficult. The incorporation of nitrogen into the gate oxide, according to the method of the present invention, also decidedly increases the resistance of the oxide to attack by halogen based etchants such as HBr, thereby improving it's effectiveness as an etch stop in the gate patterning process.

Figure 2F:
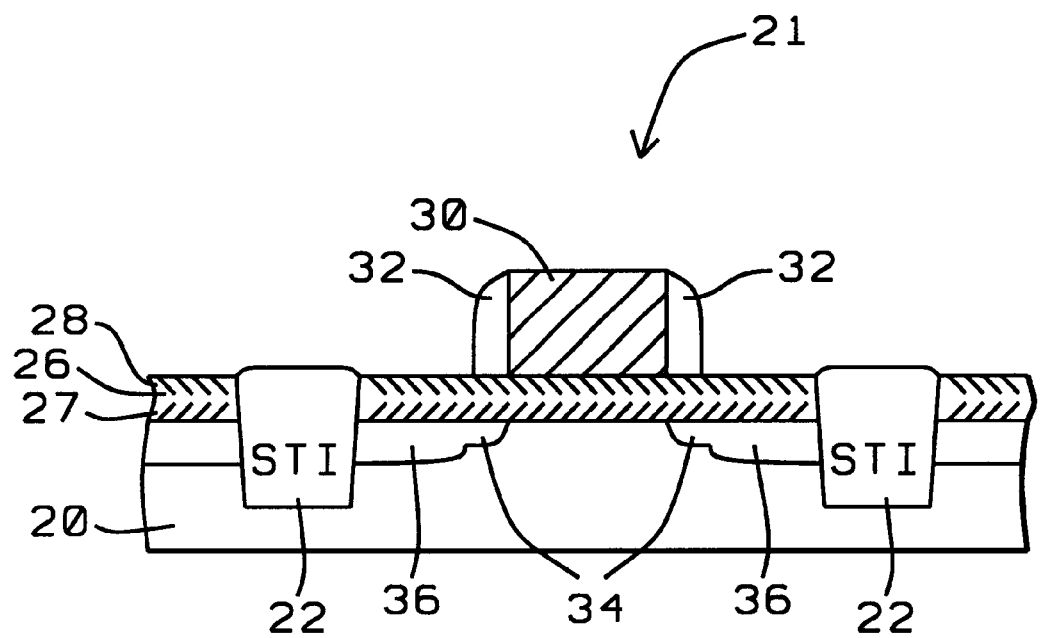

Referring to FIG. 2F, after patterning the polysilicon gate electrode 30, the MOSFET structure is completed by forming source/drain regions by ion implantation. Sidewall structures 32 are used to separately form lightly doped drain regions 34 and the heavier doped source/drain regions 36 to which contacts are later made. Methods for forming source/drain elements by the use of sidewalls are well known in the art and have been widely documented.

While the invention has been particularly shown and described with reference to the preferred embodiments thereof, it will be understood by those skilled in the art that various changes in form and details may be made without departing from the spirit and scope of the invention. While the embodiments of this invention utilize a p-type silicon substrate, an n-type silicon substrate could also be used without departing from the concepts therein provided.

It should be further understood that the substrate conductivity type as referred to herein does not necessarily refer to the conductivity of the starting wafer but could also be the conductivity of a diffused region within a wafer wherein the semiconductor devices are incorporated.

What is claimed is:

1. A method for forming a gate dielectric on a silicon wafer comprising:

(a) providing a silicon wafer;

(b) growing a screen oxide on said wafer, thereby forming an oxide/silicon interface;

(c) implanting nitrogen into said wafer;

(d) annealing said wafer, thereby accumulating and fixing said nitrogen in the silicon at said interface;

(e) removing said screen oxide;

(f) forming a gate oxide on said wafer by thermal oxidation whereby an amount of said nitrogen diffuses into a lowermost region of said gate oxide forming a nitrogen enriched lower portion of said gate oxide; and (g) infusing additional nitrogen into the upper surface of said gate oxide by a remote plasma nitridation thereby forming a nitrided upper portion of said gate oxide.

2. The method of claim 1 wherein said screen oxide is between about 45 and 55 Angstroms thick.

3. The method of claim 1 wherein said nitrogen is implanted as nitrogen molecule ions ($N_2^+$).

4. The method of claim 3 wherein said nitrogen molecule ions are implanted at a dose of between about $1 \times 10^{14}$ and $1 \times 10^{15}$ ions per cm$^2$ at an energy of between about 5 and 10 keV.

5. The method of claim 1 wherein said annealing is accomplished by rapid thermal annealing in a nitrogen ambient for between about 10 and 30 seconds at a temperature of between about 1,000 and 1,050° C.

6. The method of claim 1 wherein said gate oxide is grown to a thickness of between about 15 and 30 Angstroms.

7. The method of claim 1 wherein said gate oxide is grown at a temperature of between about 700 and 900° C.

8. The method of claim 1 wherein said gate oxide is grown by a method selected from the group consisting of in-situ steam generation and rapid thermal oxidation.

9. The method of claim 1 wherein said remote plasma nitridation is accomplished with a plasma formed in a flow of gas selected from the group consisting of nitrogen, ammonia, and a mixture of nitrogen and ammonia.

10. The method of claim 1 wherein said remote plasma nitridation is performed at a chamber pressure of between about 1 and 3 Torr.

11. The method of claim 1 wherein said wafer is heated to a temperature between about 500 and 900° C. during said remote plasma nitridation.

12. The method of claim 1 wherein said remote plasma nitridation is conducted for a period of between about 3 and 5 minutes.

13. The method of claim 1 wherein the dielectric constant of said gate oxide after said infusing is between about 4.5 and 6.0.

14. A method for forming a MOSFET with a nitrogen enriched gate oxide comprising:

(a) providing a silicon wafer;

(b) forming a field oxide isolation on said silicon wafer surrounding and defining a silicon device region;

(c) growing a screen oxide on said wafer, thereby forming an oxide/silicon interface in said device region;

(d) implanting nitrogen into said device region;

(e) annealing said wafer, thereby accumulating and fixing said nitrogen in the silicon at said interface;

(f) removing said screen oxide;

(g) forming a gate oxide on said wafer by thermal oxidation whereby an amount of said nitrogen diffuses into a lowermost region of said gate oxide forming a nitrogen enriched lower portion of said gate oxide;

(h) infusing additional nitrogen into the upper surface of said gate oxide by a remote plasma nitridation thereby forming a nitrided upper portion of said gate oxide;

(i) patterning a polysilicon gate electrode on said gate oxide over said device region; and (j) forming source/drain elements in said device region, thereby forming a MOSFET.

15. The method of claim 14 wherein said screen oxide is between about 45 and 55 Angstroms thick.

16. The method of claim 14 wherein said nitrogen is implanted as nitrogen molecule ions ($N_2^+$).

17. The method of claim 16 wherein said nitrogen molecule ions are implanted at a dose of between about $1 \times 10^{14}$ and $1 \times 10^{15}$ ions per cm$^2$ at an energy of between about 5 and 10 keV.

18. The method of claim 14 wherein said annealing is accomplished by rapid thermal annealing in a nitrogen ambient for between about 10 and 30 seconds at a temperature of between about 1,000 and 1,050° C.

19. The method of claim 14 wherein said gate oxide is grown to a thickness of between about 15 and 30 Angstroms.

20. The method of claim 14 wherein said gate oxide is grown at a temperature of between about 700 and 900° C.

21. The method of claim 14 wherein said gate oxide is grown by a method selected from the group consisting of in-situ steam generation and rapid thermal oxidation.

22. The method of claim 14 wherein said remote plasma nitridation is accomplished with a plasma formed in a flow of gas selected from the group consisting of nitrogen, ammonia, and a mixture of nitrogen and ammonia.

23. The method of claim 14 wherein said remote plasma nitridation is performed at a chamber pressure of between about 1 and 3 Torr.

24. The method of claim 14 wherein said wafer is heated to a temperature between about 500 and 900° C. during said remote plasma nitridation.

25. The method of claim 14 wherein said remote plasma nitridation is conducted for a period of between about 3 and 5 minutes.

26. The method of claim 14 wherein the dielectric constant of said gate oxide after said infusing is between about 4.5 and 6.0.

27. The method of claim 14 wherein said polysilicon gate electrode is patterned by anisotropic plasma etching with an etchant containing and HBr said plasma etching terminating within said gate oxide.

* * * * *